United States Patent
Chih et al.

(10) Patent No.: US 11,943,936 B2
(45) Date of Patent: Mar. 26, 2024

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Yu-Der Chih, Hsin-Chu (TW); May-Be Chen, Hsinchu (TW); Yun-Sheng Chen, Hsinchu County (TW); Jonathan Tsung-Yung Chang, Hsinchu (TW); Wen Zhang Lin, Hsinchu (TW); Chrong Jung Lin, Hsinchu (TW); Ya-Chin King, Taipei (TW); Chieh Lee, Miaoli County (TW); Wang-Yi Lee, Taoyuan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 238 days.

(21) Appl. No.: 17/400,615

(22) Filed: Aug. 12, 2021

(65) Prior Publication Data
US 2023/0050978 A1 Feb. 16, 2023

(51) Int. Cl.
*H10B 63/00* (2023.01)
*H01L 29/40* (2006.01)
*H01L 29/78* (2006.01)

(52) U.S. Cl.
CPC .......... *H10B 63/30* (2023.02); *H01L 29/401* (2013.01); *H01L 29/785* (2013.01)

(58) Field of Classification Search
CPC ....... H10B 63/30; H10B 63/80; H01L 29/401; H01L 29/785; H01L 29/165; H01L 29/267; H01L 29/66628; H01L 29/7848; H03K 19/0944
See application file for complete search history.

(56) References Cited

U.S. PATENT DOCUMENTS

| | | | |
|---|---|---|---|
| 9,583,167 B2 * | 2/2017 | Chan | H10B 61/22 |
| 2019/0058007 A1 * | 2/2019 | Tsai | G11C 11/1673 |
| 2022/0416158 A1 * | 12/2022 | Loy | H10N 70/8833 |

* cited by examiner

*Primary Examiner* — Farun Lu
(74) *Attorney, Agent, or Firm* — WPAT LAW; Anthony King

(57) ABSTRACT

A semiconductor device and a method of manufacturing the same are provided. The semiconductor device includes a first transistor, a first resistive random access memory (RRAM) resistor, and a second RRAM resistor. The first resistor includes a first resistive material layer, a first electrode shared by the second resistor, and a second electrode. The second resistor includes the first electrode, a second resistive material layer, and a third electrode. The first electrode is electrically coupled to the first transistor.

20 Claims, 8 Drawing Sheets

US 11,943,936 B2

SEMICONDUCTOR DEVICE AND METHOD OF MANUFACTURING THE SAME

BACKGROUND

The present invention relates to a semiconductor device, and more particularly to a layout of a semiconductor device integrated circuit (IC) designs.

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies or other technologies, low-cost fabrication, a compact structure, flexible scalability, fast switching, high integration density, etc.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
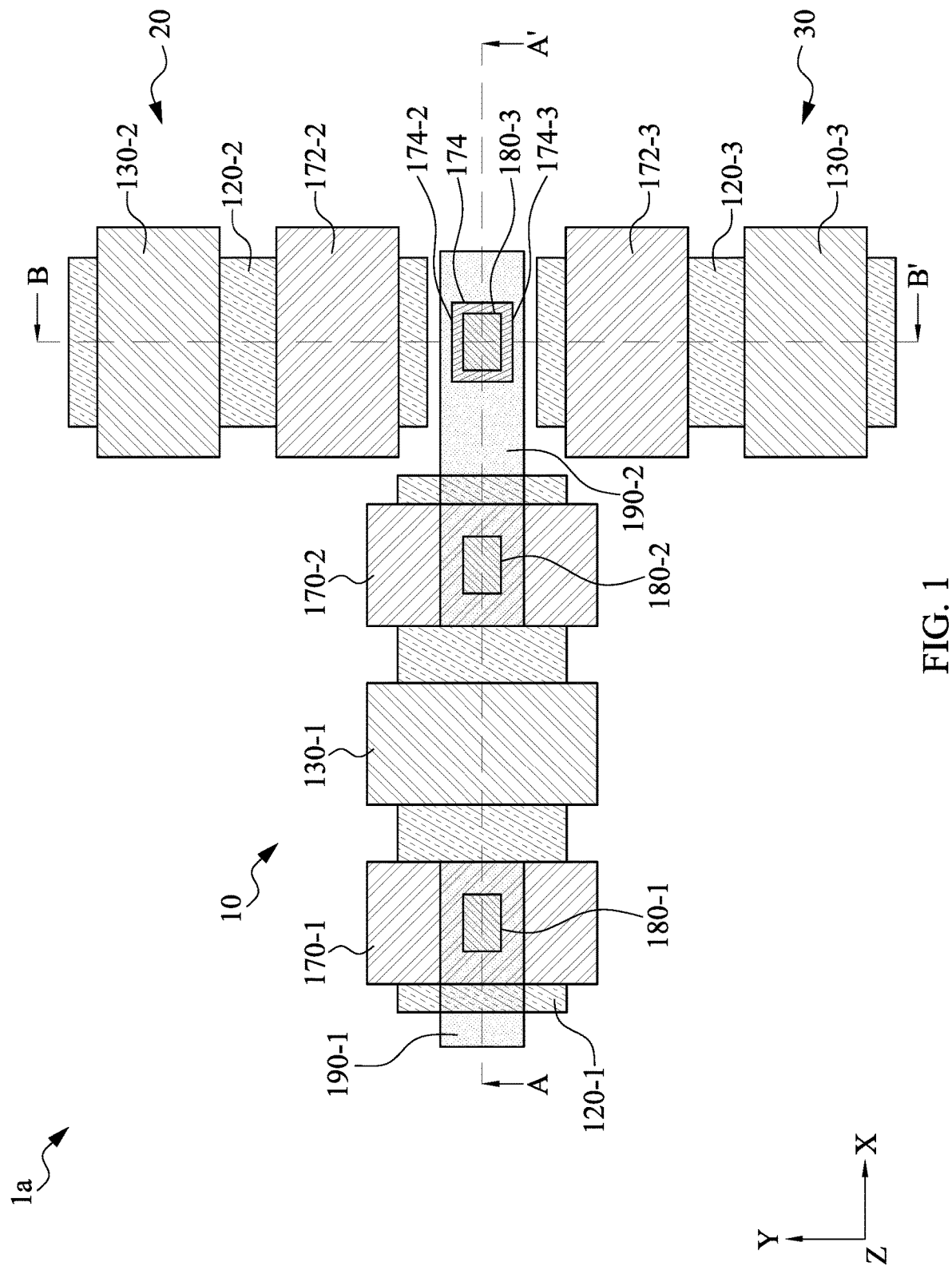
FIG. 1 illustrates a schematic view of a layout of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 illustrates a schematic view of a layout of a semiconductor device 1a, in accordance with some embodiments of the present disclosure.

The semiconductor device 1a can include devices 10, 20, and 30. In some embodiments, the device 10 can include an active region 120-1, a gate 130-1, a conductive feature 170-1, a conductive feature 170-2, a conductive via 180-1, a conductive via 180-2, a conductive feature 190-1, and a conductive feature 190-2.

The device 20 can include an active region a gate 130-2, a conductive feature 172-2, a resistive material layer 174-2, and a conductive via 180-3.

The device 30 can include an active region 120-3, a gate 130-3, a conductive feature 172-3, a resistive material layer 174-3, and the conductive via 180-3.

It should be noted that some elements of the semiconductor device 1a are not shown in FIG. 1 for clarity. The numbers of the active regions, the gates, and the metal features are given for illustrative purposes. Various numbers of the active regions, the gates, and the conductive features and other features are within the contemplated scope of the present disclosure. The terms "comprise" or "comprising," "include" or "including," "have" or "having," and the like used in this application are to be understood to be open-ended, i.e., to mean including but not limited to. Accordingly, various elements and/or structures, which are not shown in FIG. 1 and formed in the semiconductor device 1a, are within the contemplated scope of the present disclosure.

In some embodiments, the device 10 can include a transistor. In some embodiments, the device 10 can include, but is not limited to, a fin field-effect transistor (FinFET), a planar metal-oxide-semiconductor field-effect transistor (MOSFET), or other types of transistors. In some embodiments, the device 20 can include, but is not limited to, a resistive random access memory (RRAM) resistor. In some embodiments, the device 30 can include, but is not limited to, a RRAM resistor.

The RRAM resistor has two or more states with different electric resistance values that correspond to a different digital value. The RRAM resistor switches from one state to another in response to application of a predetermined voltage or current to the RRAM resistor. For example, the RRAM resistor has a state of relatively high resistance, referred to as "a high resistance state", and a state of relatively low resistance, referred to as "a low resistance state". The RRAM resistor may be switched from the high resistance state to the low resistance state, or from the low resistance state to high resistance state by applying a predetermined voltage or current to its electrodes.

In some embodiments, as shown in FIG. 1, the active region 120-1 can extend along the X direction. In some embodiments, the active regions 120-2 and 120-3 can extend along the Y direction. In some embodiments, each one of the active regions 120-1, 120-2, and 120-3 can include one or more fin structures. In various embodiments, at least one fin structure is formed on, or formed with, each one of the active regions 120-1, 120-2, and 120-3. In some embodiments, the term "active region" discussed in the present disclosure may be also referred to as "OD" (oxide dimensioned area).

In some embodiments, the gate 130-1 can extend along the Y direction. In some embodiments, the gates 130-2 and 130-3 can extend along the X direction. In some embodiments, the gate 130-1 can overlap the active region 120-1, the gate 130-2 can overlap the active region 120-2, and the gate 130-3 can overlap the active region 120-3, respectively. In some embodiments, the gates 130-1, 130-2, and 130-3 can be substantially perpendicular to the active regions 120-1, 120-2, and 120-3 in a plain view, or in the Z direction, respectively. In some embodiments, the term "gate" discussed in the present disclosure is also referred to as "PO." The terms "overlap" and "overlapping" in this disclosure are used to describe that two elements and/or features are at least partially vertically, or along the Z direction, aligned to each other.

In some embodiments, the conductive features 170-1, 1713-2, 172-2, and 172-3 may be located at a first horizontal level higher than the horizontal level of the gate 130-1. The conductive features 170-1 and 170-2 can overlap the active region 120-1. In some embodiments, the conductive features 170-1 and 170-2 can be spaced apart from each other. The conductive features 170-1 and 170-2 can be located, for example, at two opposite sides of the gate 130-1. The conductive feature 172-2 can overlap the active region 120-2. The conductive feature 172-2 can be located, for example, at a side of the gate 130-2. The conductive feature 172-3 can overlap the active region 120-3. The conductive feature 172-3 can be located, for example, at a side of the gate 130-3. In some embodiments, the conductive features 172-2 and 172-3 can be located at two opposite sides of the conductive via 180-3. In some embodiments, the term "conductive feature" located at the first horizontal level discussed in the present disclosure is also referred to as "first metal layer (M1)."

The conductive via 180-1 can be located over and electrically coupled to the conductive feature 170-1. The conductive via 180-2 can be located over and electrically coupled to the conductive feature 170-2. In some embodiments, the term "conductive via" discussed in the present disclosure is also referred to as "V1."

The conductive features 190-1 and 190-2 may be located at a second horizontal level higher than the first horizontal level. The conductive features 190-1 and 190-2 can be spaced apart from each other. The conductive feature 190-1 can be located over and electrically coupled to the conductive feature 170-1 through the conductive via 180-1. The conductive feature 190-2 can be located over and electrically coupled to the conductive feature 170-2 through the conductive via 180-2, In some embodiments, the conductive feature 190-2 can extend into between the active regions 120-2 and 120-3. In some embodiments, the conductive feature 190-2 can extend into between the conductive features 172-2 and 172-3. In some embodiments, the term "conductive feature" located at the second horizontal level discussed in the present disclosure is also referred to as "second metal layer (M2)."

The conductive via 180-3 can be electrically coupled to the conductive feature 190-2. In some embodiments, the conductive via 180-3 can be located between the active regions 120-2 and 120-3. In some embodiments, the conductive via 180-3 can be located between the conductive features 172-2 and 172-3. In some embodiments, the conductive via 180-3 is free from vertically overlapping the active region 120-1. In some embodiments, the conductive via 180-3 is free from vertically overlapping the conductive feature 170-2.

In some embodiments, the semiconductor device 1a further includes a resistive material structure 174 including the resistive material layers 174-2 and 174-3. In some embodiments, the resistive material structure 174 can surround the conductive via 180-3, In some embodiments, the resistive material structure 174 can be in contact with the conductive via 180-3. In some embodiments, the resistive material layers 174-2 and 174-3 can be located at two opposite sidewalls of the conductive via 180-3.

In some embodiments, the device 20 can include, but is not limited to, a RRAM resistor. In some embodiments, the device 20 can include a resistor structure including the conductive feature 172-2, the resistive material layer 174-2, and the conductive via 180-3. The conductive feature 172-2 can serve as a portion of the bottom electrode of the RRAM resistor, and the conductive via 180-3 can serve as a portion of the top electrode of the RRAM resistor.

In some embodiments, the device 30 can include, but is not limited to, a RRAM resistor. In some embodiments, the device 30 can include a resistor structure including the conductive feature 172-3, the resistive material layer 174-3, and the conductive via 180-3. The conductive feature 172-3 can serve as a portion of the bottom electrode of the RRAM resistor, and the conductive via 180-3 can serve as a portion of the top electrode of the RRAM resistor. In some embodiments, the conductive via 180-3 is electrically coupled to the device 10. In some embodiments, the conductive via 180-3 can serve as a common electrode shared by the devices 20 and 30. In some embodiments, the devices 20 and 30 can collaboratively define a twin bit RRAM resistor device.

Figure 2:
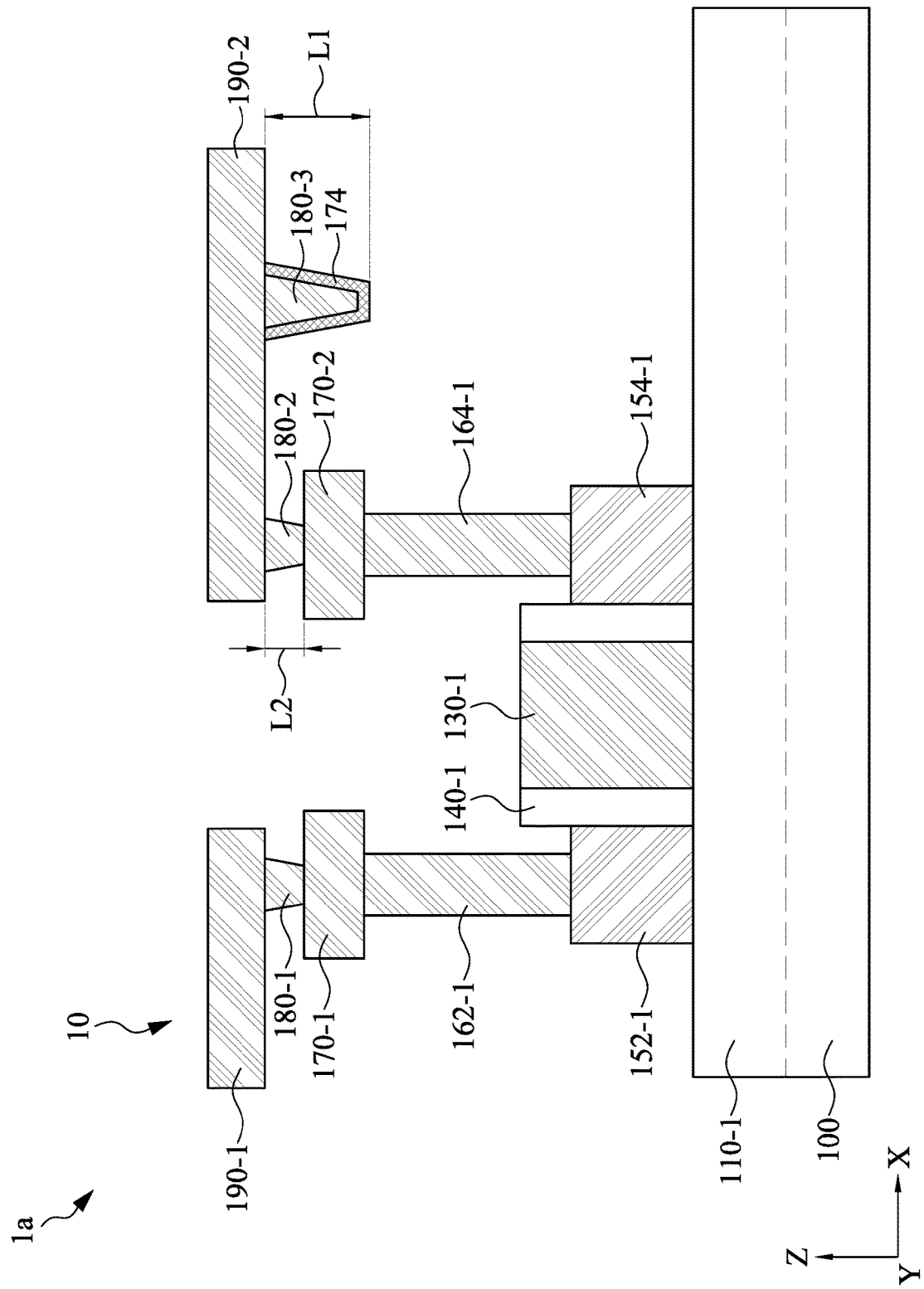
FIG. 2 illustrates a schematic view of a cross-sectional view along line A-A' of the semiconductor device shown in FIG. 1, in accordance with some embodiments of the present disclosure.

FIG. 2 illustrates a schematic view of a cross-sectional view along line A-A' of the semiconductor device 1a shown in FIG. 1, in accordance with some embodiments of the present disclosure.

In some embodiments, the device 10 can further includes a substrate 100, a fin 110-1, sidewalls 140-1, source and drain structures (S/D features) 152-1 and 154-1, an electrical conductor 162-1, and an electrical conductor 164-1. It should be noted that some elements are not illustrated in FIG. 2 for brevity. In some embodiments, the device 10 can include other elements or features, such as dielectric layers, etching stop layers, interlayer dielectric (ILD), doped regions and other elements or features.

The substrate 100 can be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. Other substrates, such as a multi-layered or gradient substrate may also be used. In some embodiments, the semiconductor material of the substrate 100 may include silicon; germanium; a compound semiconductor including silicon carbide, gallium arsenic, gallium phosphide, indium phosphide, indium arsenide, and/or indium antimonids; an alloy semiconductor including Sire, GaAsP, AlInAs, AlGaAs, GaInAs, GaInP, and/or GaInAsP; or combinations thereof. The substrate 100 may include a plurality of regions (not shown) for forming p-type devices and/or n-type devices, such as PMOS and/or transistors, e.g., p-type FinFETs and/or n-type FinFETs.

The fin 110-1 can be disposed on the substrate 100. The fin 110-1 can include a semiconductor strip. In some embodiments, the fin 110-1 may protrude from the substrate 100 by etching the substrate 100. In some embodiments, the fin 110-1 can correspond to the active region 120-1 of FIG. 1.

In some embodiments, the gate 130-1 can include a gate dielectric layer (not shown) and a gate electrode layer (not shown). The gate dielectric layer can be disposed on the fin 110-1. The gate dielectric layer may be a single layer or multiple layers. In some embodiments, the gate dielectric layer may include silicon oxide ($SiO_x$), silicon nitride ($Si_xN_y$) silicon oxynitride (SiON), or a combination thereof. In some embodiments, the gate dielectric layer may include dielectric material(s), such as high-k dielectric material. The high-k dielectric material may have a dielectric constant (k value) greater than 4. The high-k material may include hafnium oxide ($HFO_2$), zirconium oxide ($ZrO_2$), lanthanum oxide ($La_2O_3$) yttrium oxide ($Y_2O_3$), aluminum oxide ($Al_2O_3$), titanium oxide ($TiO_2$) or another applicable material. Other suitable materials are within the contemplated scope of the disclosure.

The gate electrode layer can be disposed on the gate dielectric layer. The gate electrode layer is made of conductive material, such as aluminum (Al), copper (Cu), tungsten (W), titanium (Ti), tantalum (Ta), or other applicable materials. In some embodiments, the gate electrode layer includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure.

The sidewalls 140-1 can be disposed on two opposite sides of the gate 130-1. The sidewall 140-1 can be a single layer structure or a multi-layer structure. In some embodiments, the sidewall 140-1 can include $SiO_2$, SiN, SiCN, SiOCN, SiC, SiOC, SiON, or the like, or combinations thereof.

In some embodiments, the S/D features 152-1 and 154-1 can be formed on the fin 110-1. The S/D features 152-1 and 154-1 can be formed on opposite sides of the gate 130-1. In some embodiments, the S/D features 152-1 and 154-1 are doped regions configured for a PMOS device or P-type FinFET and include p-type dopants, such as boron, $BF_2^+$, and/or a combination thereof. In alternative embodiments, the S/D features 152-1 and 154-1 are doped regions configured for an NMOS device or N-type FinFET, and include n-type dopants, such as phosphorus, arsenic, and/or a combination thereof.

In some other embodiments, the S/D features 152-1 and 154-1 are strained layers formed by an epitaxial growing process such as a selective epitaxial growing process. In some embodiments, recesses are formed in the fins on sides of the gate 130-1, and the strained layers are formed by selectively growing epitaxy layers from the fins exposed in the recesses. In some embodiments, the strained layers include silicon germanium (SiGe), SiGeB, Ge, InSb, GaSb, InGaSb or combinations thereof for a P-type MOS or FinFET device. In alternative embodiments, the strained layers include silicon carbon (SiC), silicon phosphate (SiIo), SiCP, InP, GaAs, AlAs, InAs, InAlAs, InGaAs or a SiC/SiP multi-layer structure, or combinations thereof for an N-type MOS or FinFET device. In some embodiments, the strained layers may be optionally implanted with an N-type dopant or a P-type dopant as needed.

The electrical conductor 162-1 can be disposed on and electrically coupled to the S/D feature 152-1. The electrical conductor 164-1 can be disposed on and electrically coupled to the S/I) feature 154-1. The electrical conductor 162-1 and the electrical conductor 164-1 may include conductive materials, such as metal, metal nitride, alloy or other suitable materials. In some embodiments, the term "electrical conductor" discussed in the present disclosure is also referred to as "MD."

The conductive feature 170-1 can be disposed on and electrically coupled to the S/D feature 152-1 through the electrical conductor 162-1. The conductive feature 170-2 can be disposed on and electrically coupled to the S/D feature 154-1 through the electrical conductor 164-1. The conductive features 170-1 and 170-2 may include conductive materials, such as metal, metal nitride, alloy or other suitable materials.

The conductive via 180-1 can be disposed on and electrically coupled to the conductive feature 170-1. The conductive via 180-2 can be disposed on and electrically coupled to the conductive feature 170-2. The conductive via 180-1 and the conductive via 180-2 may include conductive materials, such as metal, metal nitride, alloy or other suitable materials. In some embodiments, the conductive via 180-1 and the conductive via 180-2 can further include a barrier layer (not shown), such as metal nitride or other suitable materials.

The conductive feature 190-1 can be disposed on and electrically coupled to the conductive via 180-1. The conductive feature 190-2 can be disposed on and electrically coupled to the conductive via 180-2. The material of the conductive features 190-1 and 190-2 can be the same as or similar to that of the conductive feature 170-1.

The resistive material structure 174 can surround the conductive via 180-3. The resistive material structure 174 include oxide, nitride, oxynitride of metal, such as W, Ta, Ti, Ni, Co, Hf, Ru, Zr, Zn, Fe, Sn, Al, Cu, Ag, Mo, Cr.

The conductive via 180-3 can be electrically coupled to the S/D feature 154-1, The conductive via 180-3 can protrude from a bottom surface of the conductive feature 190-2. The conductive via 180-3 can have a vertical length L1, and the conductive via 180-2 can have a vertical length L2. In some embodiments, L1 is greater than L2. In some embodiments, the conductive via 180-3 can extend to a horizontal level at which the conductive feature 170-2 is located. In some embodiments, a portion of the conductive via 180-3 is located at the first horizontal level.

Figure 3:
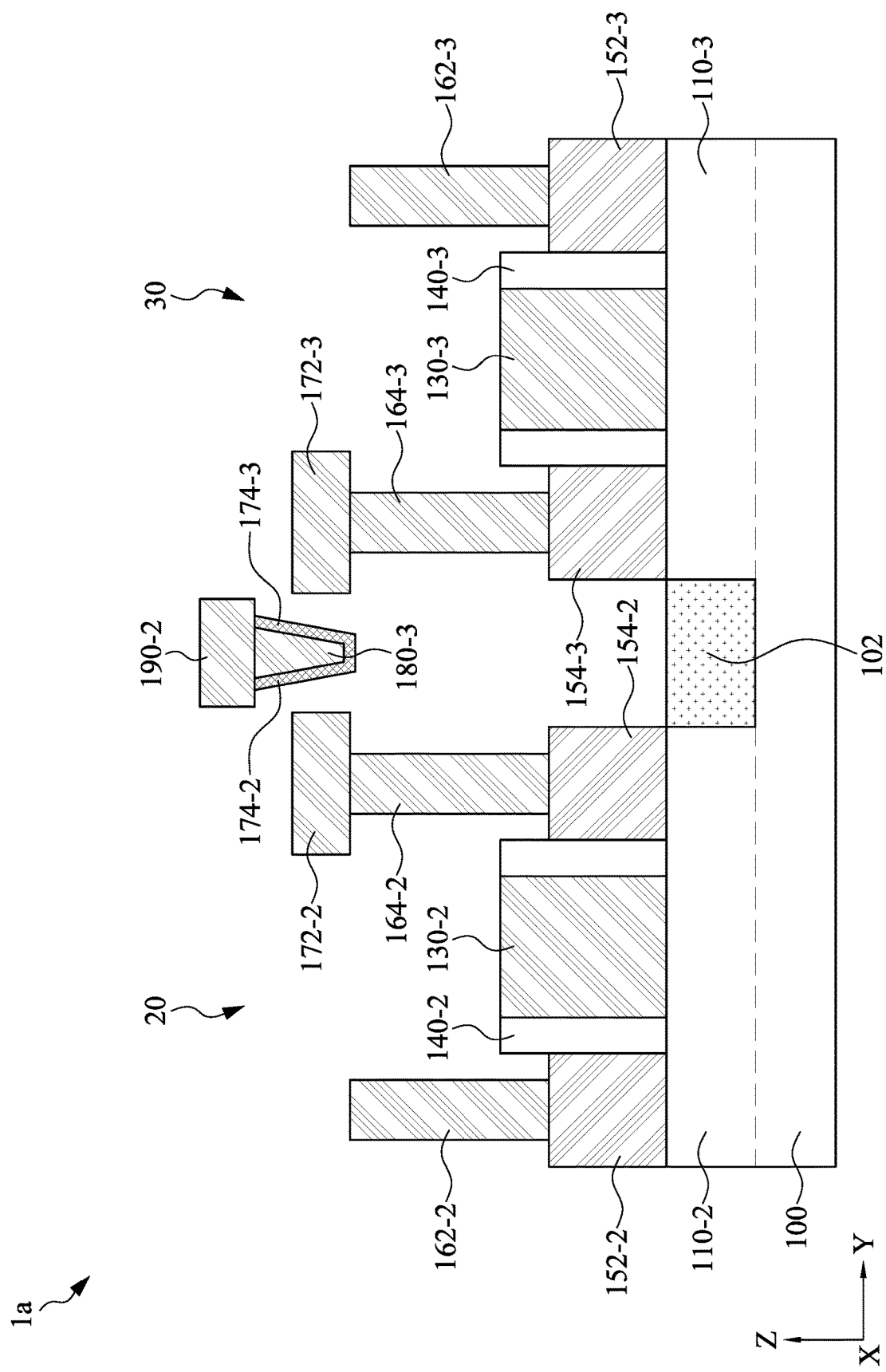
FIG. 3 illustrates a schematic view of a cross-sectional view along line B-B' of the semiconductor device shown in FIG. 1, in accordance with some embodiments of the present disclosure.

FIG. 3 illustrates a schematic view of a cross-sectional view along line B-B' of the semiconductor device 1a shown in FIG. 1, in accordance with some embodiments of the present disclosure.

In some embodiments, the device 20 can further includes a fin 110-2, sidewalls 140-2, S/D features 152-2 and 154-2, an electrical conductor 162-2, and an electrical conductor 164-2, In some embodiments, the device 30 can further includes a fin 110-3, sidewalls 140-3, S/D features 152-3 and 154-3, an electrical conductor 162-3, and an electrical conductor 164-3.

The fins 110-2 and 110-3 can be disposed on the substrate 100. The fin 110-2 can be separated from the fin 110-3 by an isolation structure 102. The material and the structure of the fins 110-2 and 110-3 can be the same as or similar to those of the fin 110-1. In some embodiments, the fins 110-2 and 110-3 can correspond to the active regions 120-2 and 120-3 of FIG. 1, respectively.

The sidewalls 140-2 can be disposed on two opposite sides of the gate 130-2, The sidewalls 140-3 can be disposed on two opposite sides of the gate 130-3. The material and the structure of the sidewalls 140-2 and 140-3 can be the same as or similar to those of the sidewall 140-1.

The S/D features 152-2 and 154-2 can be formed on opposite sides of the gate 130-2. The S/D features 152-3 and 154-3 can be formed on opposite sides of the gate 130-3. The material and the structure of the S/D features 152-2, 152-3, 154-2 and 154-3 can be the same as or similar to those of the S/D feature 152-1.

The electrical conductor 162-2 can be disposed on and electrically coupled to the S/D feature 152-2. The electrical conductor 164-2 can be disposed on and electrically coupled to the S/D feature 154-2. The electrical conductor 162-3 can be disposed on and electrically coupled to the S/D feature 152-3. The electrical conductor 164-3 can be disposed on and electrically coupled to the S/D feature 154-3. The material and the structure of the electrical conductors 162-2, 162-3, 164-2, and 164-3 can be the same as or similar to those of the electrical conductor 162-1.

The conductive feature 172-2 can be disposed on and electrically coupled to the S/D feature 154-2 through the electrical conductor 164-2. The conductive feature 172-3 can be disposed on and electrically coupled to the S/D feature 154-3 through the electrical conductor 164-3. The material and the structure of the conductive features 172-2 and 172-3 can be the same as or similar to those of conductive feature 170-1.

The conductive via 180-3 can be disposed between the conductive features 172-2 and 172-3. The resistive material layer 174-2 can be disposed between the conductive feature 172-2 and the conductive via 180-3, and therefore the conductive feature 172-2, the resistive material layer 174-2, and the conductive via 180-3 collaboratively define a RRAM resistor. The resistive material layer 174-3 can be disposed between the conductive feature 172-3 and the conductive via 180-3, and therefore the conductive feature 172-3, the resistive material layer 174-3, and the conductive via 180-3 collaboratively define a RRAM resistor.

In the embodiments of the disclosure, the structure and the manufacturing method of the RRAM resistor can be integrated with those of a FinFET transistor. Further, the conductive feature 172-2, the resistive material layer 174-2, the conductive feature 172-3, the resistive material layer 174-3, and the conductive via 180-3 can collaboratively define a twin bit RRAM resistor device, which can be applicable to various circuits.

Figure 4:
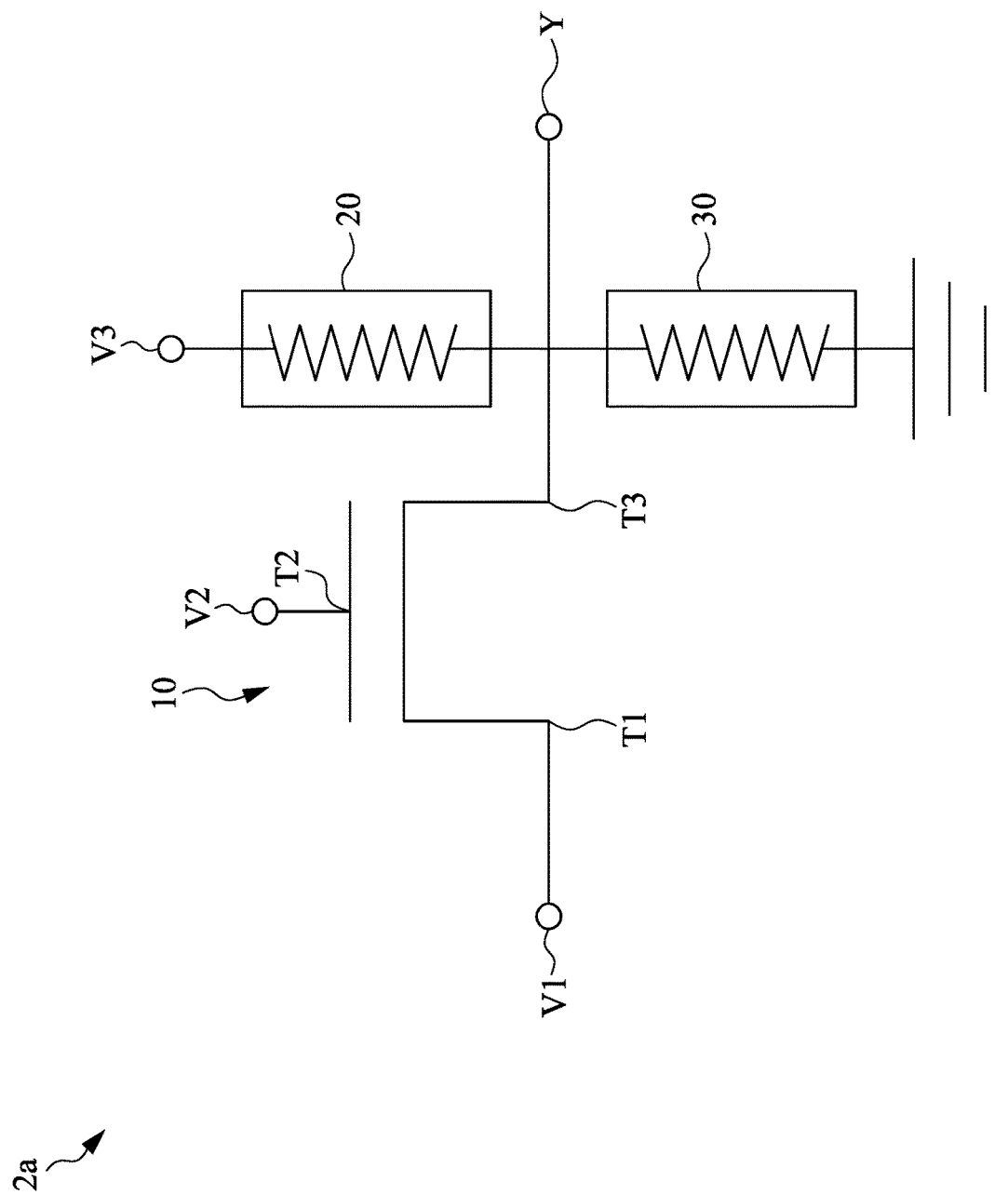
FIG. 4 illustrates a schematic view of a circuit of the semiconductor device shown in FIG. 1, in accordance with some embodiments of the present disclosure.

FIG. 4 illustrates a schematic view of a circuit 2a of the semiconductor device 1a shown in FIG. 1, in accordance with some embodiments of the present disclosure.

The circuit 2a can be configured to perform a data access operation. The data access operation includes a read operation, a write operation, and a clear operation. Thus, the data access operation in this disclosure is not limited herein. The data can include, for example, a logic high value (for example, "1") and a logic low value (for example, "0").

In some embodiments, the circuit 2a can include device 10, 20 and 30. In some embodiments, the device 10 can have terminals T1, T2, and T3. The terminal T1 can be electrically coupled to a supply voltage V1 and can serve as an input data terminal. The terminal T2 can be electrically coupled to a supply voltage V2 and can serve as a set terminal. The terminal T3 can be electrically coupled to the devices 20 and 30. The device 20 can be electrically coupled to a supply voltage V3. The device 30 can be electrically coupled to ground. The circuit 2a can control a logic output node Y.

During the clear operation, the supply voltage V2 can have a voltage higher than those of the power supplies V1 and V3, and the supply voltage V3 can have a voltage greater than that of the supply voltage Vt. Both the devices 20 and 30 can be switched into the high resistance state. As a result, a current can flow from the supply voltage V3 to ground.

During the "write 0" operation, the device 10 is turned on, and the supply voltage V3 can have a voltage substantially equal to that of the supply voltage V1. The device 20 is switched into the high resistance state, and the device 30 is switched into the low resistance state. As a result, a current can flow from the device 10 to ground.

During the "read 0" operation, the device 10 is turned off, the device 20 is at the high resistance state, and the device 30 is at the low resistance state. As a result, a current can flow from ground to the logic output node Y.

During the "write 1" operation, the device 10 is turned on, and the supply voltage V3 can have a voltage greater than that of the supply voltage V1. The device 20 is switched into the low resistance state, and the device 30 is switched into the high resistance state. As a result, a current can flow from the supply voltage V3 to the device 10.

During the "read 1" operation, the device 10 is turned off, the device 20 is at the low resistance state, and the device 30 is at the high resistance state. As a result, a current can flow from the supply voltage V3 to the logic output node Y.

Figure 5:
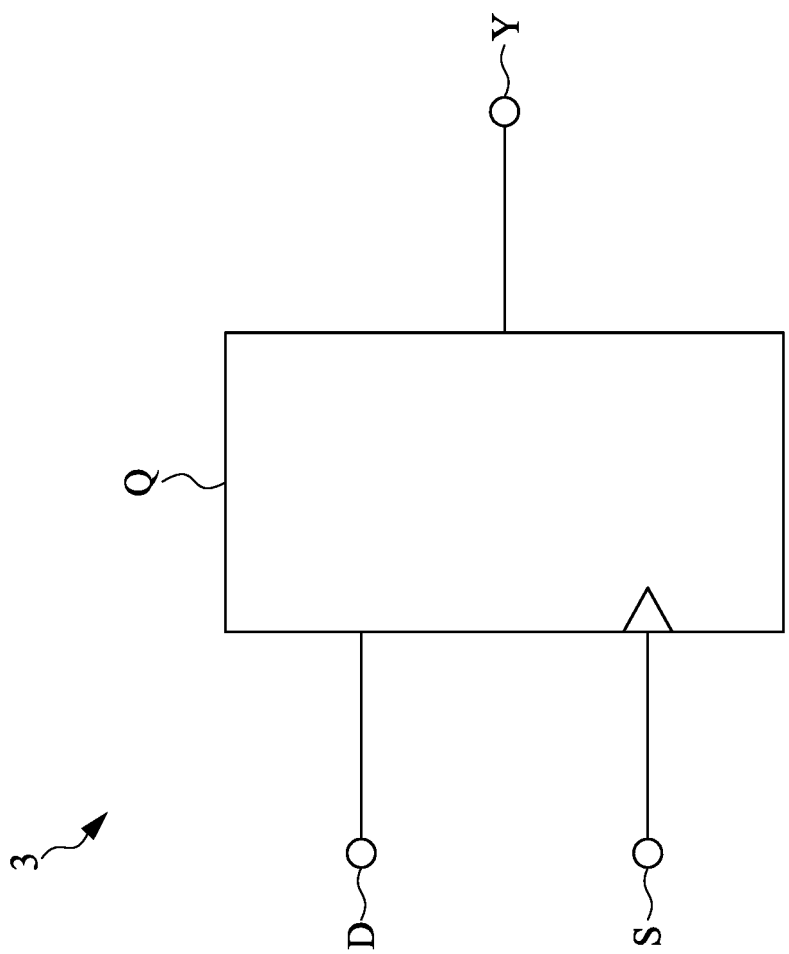
FIG. 5 illustrates a schematic view of a circuit, in accordance with some embodiments of the present disclosure.

FIG. 5 illustrates a schematic view of a circuit diagram of a logic gate 3, in accordance with some embodiments of the present disclosure.

In some embodiments, the circuit 2a shown in FIG. 4 can be utilized as a logic gate. The logical operations of the logic gate 3 can follow the truth table (Table 1) shown below. The circuit 2a can use the signal received from the input data terminal "D" of the logic gate 3, and use the signal received from the set terminal "S" of the logic gate 3.

Further, "Q" is defined as logical "0" when the device 20 is at the high resistance state, and the device 30 is at the low resistance state. "Q" is defined as logical "1" when the device 20 is at the low resistance state, and the device 30 is at the high resistance state. The signal outputted by the output node "Y" can be obtained in accordance with the equation: Y=S×D+Q.

TABLE 1

| S | D | Q | Y |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |

In some embodiments, a logical state of Y can be determined by the truth table and a combination of logical states of S, D, and Q. For example, when the logical states of S, D, and Q are at a logical "1", a logical "0" and a logical "1" respectively, according to the truth table, Y is at a logical state "0".

in some embodiments, the twin bit RRAM resistor device can also be applicable to a one-time programmable (OTP) device. For example, the conductive features 172-2 and the conductive feature 172-3 are electrically coupled to S/D features 154-2 and 154-3, respectively. The gates 130-2 and 130-3 can be electrically coupled to word lines, the S/D features 152-2 and 152-3 can be electrically coupled to bit lines. The node between the devices 20 and 30 can be electrically coupled to a source line. The gates 130-2 and 130-3 can perform a set and a reset operations, and further perform the read of selected operation.

Figure 6:
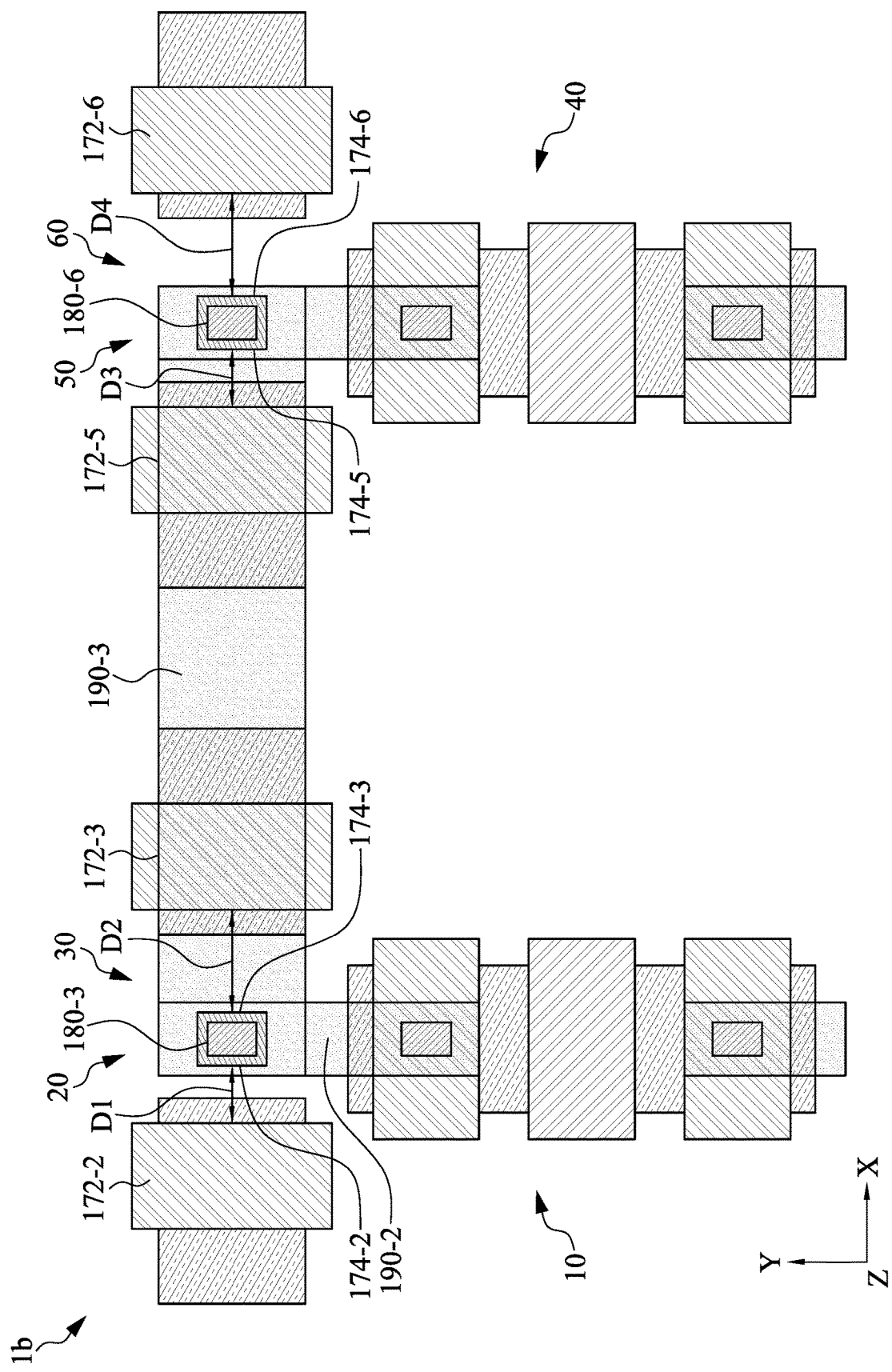
FIG. 6 illustrates a schematic view of a layout of a semiconductor device, in accordance with some embodiments of the present disclosure.

FIG. 6 illustrates a schematic view of a layout of a semiconductor device 1b, in accordance with some embodiments of the present disclosure. The semiconductor device 1b can be similar to the semiconductor device 1a, except that the semiconductor device 1b can further include devices 40, 50, and 60.

The device 40 can be the same as or similar to the device 10. The device 50 can include, but is not limited to, a RRAM resistor. In some embodiments, the device 50 can include a resistor structure including a conductive feature 172-5, a resistive material layer 174-5, and a conductive via 180-6. The conductive feature 172-5 can serve as a portion of the bottom electrode of the RRAM resistor, and the conductive via 180-6 can serve as a portion of the top electrode of the RRAM resistor.

The device 60 can include, but is not limited to, a RRAM resistor. In some embodiments, the device 60 can include a resistor structure including the conductive feature 172-6, the resistive material layer 174-6, and the conductive via 180-6. The conductive feature 172-6 can serve as a portion of the bottom electrode of the RRAM resistor, and the conductive via 180-6 can serve as a portion of the top electrode of the IMAM resistor. In some embodiments, the conductive via 180-6 is electrically coupled to the device 40. In some embodiments, the conductive via 180-6 can serve as a common electrode shared by the devices 50 and 60. In some embodiments, the devices 50 and the 60 can collaboratively define a twin bit RRAM resistor device. The conductive via 180-3 can be electrically coupled to the conductive via 180-6 through a conductive feature 190-3. In some embodiments, the conductive feature 190-3 can be located at the second horizontal level. In some embodiments, the conductive feature 190-3 can be in contact with the conductive feature 190-2 and electrically connected to the device 10.

In some embodiments, the devices 20, 30, 50, and 60 can be aligned to each other along the X direction. In some embodiments, conductive features 172-2, 172-3, 172-5, and 172-6 can be aligned to each other along the X direction.

The conductive feature 172-2 and the conductive via 180-3 can be spaced apart by a distance D1, The conductive feature 172-3 and the conductive via 180-3 can be spaced apart by a distance D2. The conductive feature 172-5 and the conductive via 180-6 can be spaced apart by a distance D3. The conductive feature 172-6 and the conductive via 180-6 can be spaced apart by a distance D4. In some embodiments, D2 can be different from D1. In some embodiments, D2 can be greater than D1. In some embodiments, D4 can be different from D3. In some embodiments, D4 can be greater than D3. In some embodiments, a sum of the D1 and D4 is substantially equal to that of the D2 and D3.

Figure 7:
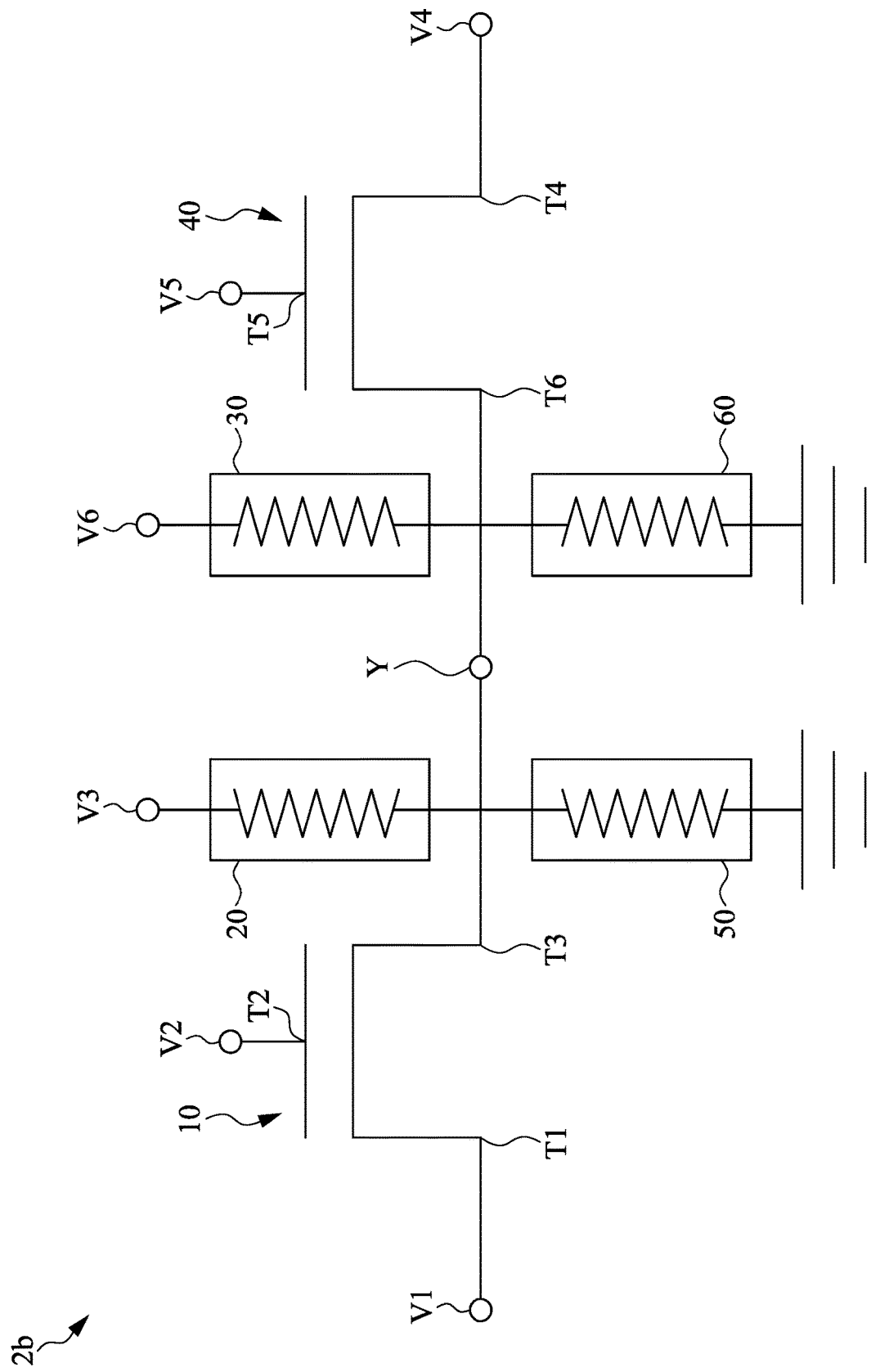
FIG. 7 illustrates a schematic view of a circuit of the semiconductor device shown in FIG. 6, in accordance with some embodiments of the present disclosure.

FIG. 7 illustrates a schematic view of a circuit 2b of the semiconductor device 1b shown in FIG. 6, in accordance with some embodiments of the present disclosure.

In some embodiments, the device 40 can have terminals T4, T5, and 16. The terminal T4 can be electrically coupled to a supply voltage V4 and can serve as an input data terminal. The terminal T5 can be electrically coupled to a supply voltage V5 and can serve as a set terminal. The terminal T6 can be electrically coupled to the devices 50 and 60. In some embodiments, the device 20 can be electrically coupled to supply voltage V3, the device 30 can be electrically coupled to supply voltage V6, the device 50 can be electrically coupled to ground, and the device 60 can be electrically coupled to ground. The circuit 2b can control a logic output node Y.

As shown in FIG. 6, when the formation of the conductive via 180-3 has a misalignment, D1 will be different from D2, causing the resistance of the devices 20 and 30 to be different/mismatched. This issue can be levitated by having the devices 50 and 60.

In this embodiment, the circuit 2b includes the two twin bit RRAM resistor devices aligned to each other. In some embodiments, when the conductive via 180-3 and conductive via 180-6 have misalignments, the conductive via 180-3 and conductive via 180-6 may tend to shift in the same direction, causing D3 to have a shift the same as that of D1, and causing 134 to have a shift the same as that of D2. As shown in FIG. 7, when the resistances of the devices 20 becomes relatively smaller and the device 30 becomes relatively greater due to misalignment, the resistances of the devices 50 and 60 can become relatively smaller and relatively greater correspondingly.

The devices 20 and 50 that have a relatively smaller resistance can be configured to be a twin bit RRAM resistor device. The devices 30 and 60 that have a relatively greater resistance can be configured to be a twin bit RRAM resistor device.

Therefore, the resistance matching of all RRAM resistors of the circuit 2b can be improved, even if the locations of the conductive vias 180-3 and 180-6 are shifted.

Figure 8:
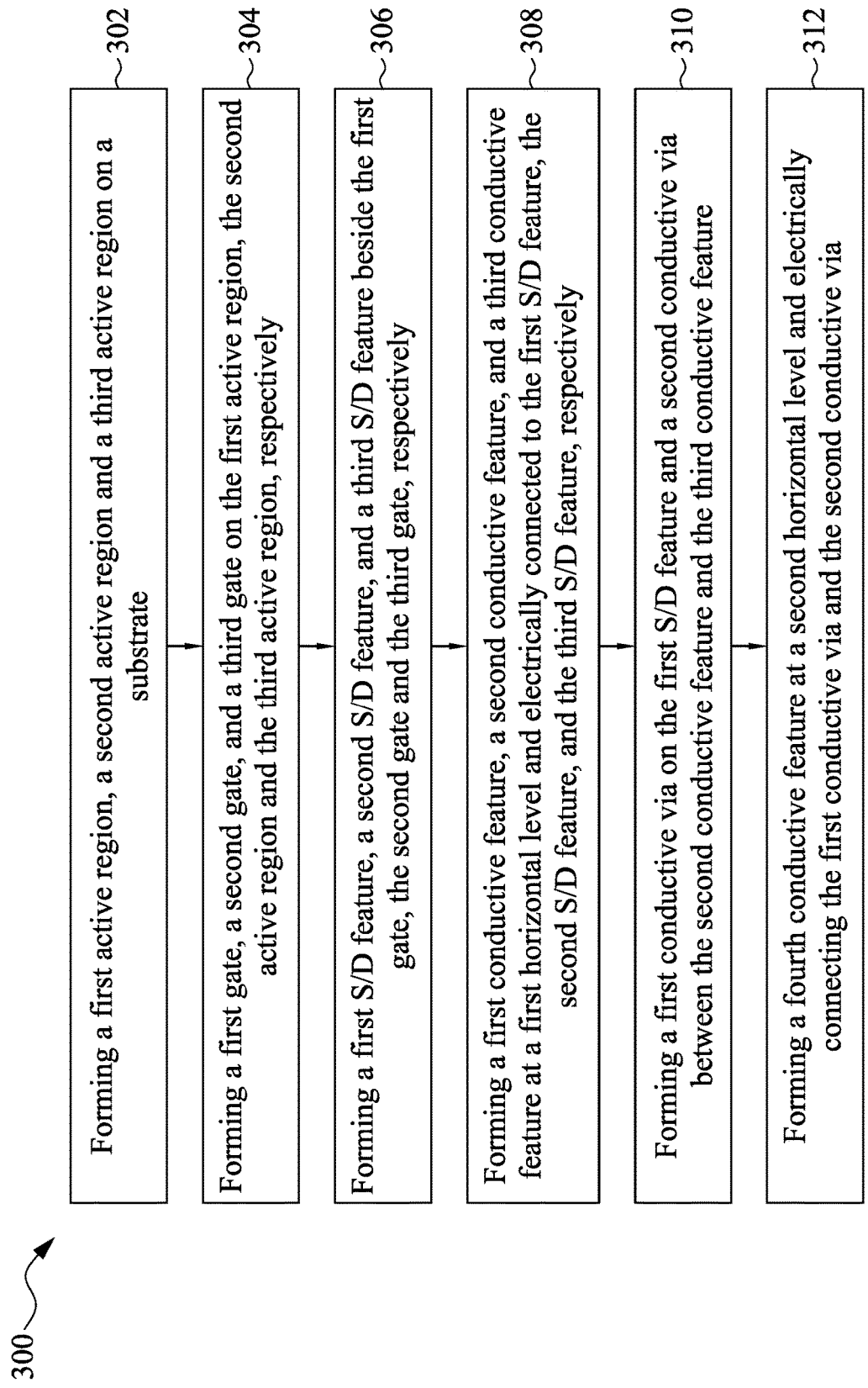
FIG. 8 is a flow chart illustrating a method for manufacturing a semiconductor device, in accordance with various aspects of the present disclosure.

FIG. 8 is a flow chart illustrating a method 300 for manufacturing a semiconductor device, in accordance with various aspects of the present disclosure.

The method 300 begins with operation 302 in which a first active region, a second active region and a third active region are formed on a substrate. For example, the operation 302 can include forming the active regions 120-1, 120-2, and 120-3 as shown in FIGS. 1-3.

The method 300 continues with operation 304 in which a first gate, a second gate, and a third gate are formed on the first active region, the second active region and the third active region, respectively. For example, the operation 304 can include forming the gate 130-1, the gate 130-2, and the gate 130-3 as shown in FIGS. 1-3.

The method 300 continues with operation 306 in which a first SID feature, a second S/D feature, and a third S/D feature are formed beside the first gate, the second gate and the third gate, respectively. For example, the operation 306 can include forming the S/D feature 152-1, the S/D feature 154-1, the S/D feature 152-2, the S/D feature 154-2, the S/D feature 152-3, and the S/D feature 154-3 as shown in FIGS. 1-3.

The method 300 continues with operation 308 in which a first conductive feature, a second conductive feature, and a third conductive feature are formed. The first conductive feature, the second conductive feature, and the third conductive feature are located at a first horizontal level and electrically coupled to the first S/D feature, the second S/D feature, and the third S/D feature, respectively. For example, the operation 308 can include forming the conductive features 170-2, 172-2, and 172-3 as shown in FIGS. 1-3.

The method 300 continues with operation 310 in which a first conductive via and a second conductive via are formed. The first conductive via is located on the first conductive feature. The second conductive via is located between the second conductive feature and the third conductive feature. For example, the operation 310 can include forming the conductive via 180-2 and the conductive via 180-3 as shown in FIGS. 1-3.

The method 300 continues with operation 312 in which a fourth conductive feature is formed at a second horizontal level and electrically connecting the first conductive via and the second conductive via. For example, the operation 312 can include forming the conductive feature 190-2 as shown in FIGS. 1-3.

The method 300 is merely an example, and is not intended to limit the present disclosure beyond what is explicitly recited in the claims. Additional operations can be provided before, during, and after the method 300, and some operations described can be replaced, eliminated, or moved around for additional embodiments of the method.

Some embodiments of the present disclosure provide a semiconductor device. The semiconductor device includes a first transistor, a first resistive random access memory (RRAM) resistor, and a second RRAM resistor. The first resistor includes a first resistive material layer, a first electrode shared by the second resistor, and a second electrode. The second resistor includes the first electrode, a second resistive material layer, and a third electrode. The first electrode is electrically coupled to the first transistor.

Some embodiments of the present disclosure provide a semiconductor device. The semiconductor device includes a first device, a second device, and a third device. The first device includes a first conductive feature at a first horizontal level, a second conductive feature at a second horizontal level different from the first horizontal level and electrically coupled to the first conductive feature, and an electrode protrudes from the second conductive feature. The second device includes a third conductive feature at the first horizontal level. The third device includes a fourth conductive feature at the first horizontal level. The electrode is located between the third conductive feature and the fourth conductive feature.

Some embodiments of the present disclosure provide a method of manufacturing a semiconductor device. The method includes: providing a substrate; forming a first gate structure and a second gate structure on the substrate; forming a first source/drain feature beside the first gate structure and a second SID feature beside the second gate structure; forming a first conductive feature at a first horizontal level and electrically coupled to the first S/D feature and a second conductive feature at the first horizontal level and electrically coupled to the second S/D feature; forming a first conductive via on the first conductive feature; forming a second conductive via beside the second conductive feature and a resistive material layer around the second conductive via; and forming a third conductive feature at a second horizontal level different from the first horizontal level and electrically connecting the first conductive via and the second conductive via, wherein the second conductive via and the second conductive feature collaboratively define a first resistive random access memory (RRAM) resistor.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first transistor, comprising:
     a first gate structure over a first fin;
     a first source/drain (S/D) feature;
     a first conductive feature electrically coupled to the first S/D feature; and
     a second conductive feature disposed on the first conductive feature;
   a first resistive random access memory (RRAM) resistor; and a second RRAM resistor, wherein
the first RRAM resistor comprises a first resistive material layer, a first electrode shared by the second RRAM resistor, a second electrode, a second gate structure over a second fin, and a second S/D feature electrically coupled to the second electrode;
the second RRAM resistor comprises the first electrode, a second resistive material layer, and a third electrode;
the first electrode is electrically coupled to the first transistor and protrudes from the second conductive feature of the first transistor; and
the first fin extends along a first direction, and the second fin extends along a second direction different from the first direction.

2. The semiconductor device of claim 1, wherein the first conductive feature of the first transistor is located at a first horizontal level, and the second electrode of the first RRAM resistor is located at the first horizontal level.

3. The semiconductor device of claim 1, wherein the first transistor comprises a conductive via between the first conductive feature and the second conductive feature, the first electrode has a first vertical length, and the conductive via has a second vertical length smaller than the first vertical length.

4. The semiconductor device of claim 1, further comprising:
a circuit, comprising:
a second transistor;
a third RRAM resistor; and
a fourth RRAM resistor,
wherein the circuit is electrically coupled to the second conductive feature of the first transistor.

5. The semiconductor device of claim 4, wherein each of the first RRAM resistor, the second RRAM resistor, the third RRAM resistor, and the fourth RRAM resistor are aligned to each other in the second direction.

6. The semiconductor device of claim 4, wherein the third RRAM resistor comprises a fourth electrode shared by the fourth RRAM resistor, a third resistive material layer, and a fifth electrode, the fourth RRAM resistor comprises the fourth electrode, a fourth resistive material layer, and a sixth electrode, and the fourth electrode is electrically coupled to the first electrode.

7. The semiconductor device of claim 6, wherein the first electrode and the second electrode are spaced apart by a first distance, the first electrode and the third electrode are spaced apart by a second distance greater than the first distance, the fourth electrode and the fifth electrode are spaced apart by a third distance, the fourth electrode and the sixth electrode are spaced apart by a fourth distance greater than the third distance, and a sum of the first distance and the fourth distance is substantially equal to that of the second distance and the third distance.

8. The semiconductor device of claim 1, wherein the first resistive material layer is in contact with a first sidewall of the first electrode, and the second resistive material layer is in contact with a second sidewall opposite to the first sidewall of the first electrode.

9. The semiconductor device of claim 1, wherein the first conductive feature is a first metal layer, and the second conductive feature is a second metal layer.

10. A semiconductor device, comprising:
a first transistor, comprising:
a first conductive feature; and
a second conductive feature disposed on the first conductive feature;
a first resistive random access memory (RRAM) resistor; and
a second RRAM resistor, wherein the first RRAM resistor comprises a first resistive material layer, a first electrode shared by the second RRAM resistor, and a second electrode; the second RRAM resistor comprises the first electrode, a second resistive material layer, and a third electrode; the first electrode is electrically coupled to the first transistor, and wherein the first electrode protrudes from the second conductive feature of the first transistor; and
a circuit, comprising:
a second transistor;
a third RRAM resistor; and
a fourth RRAM resistor, wherein the circuit is electrically coupled to the second conductive feature of the first transistor, wherein the third RRAM resistor comprises a fourth electrode shared by the fourth RRAM resistor, a third resistive material layer, and a fifth electrode, the fourth RRAM resistor comprises the fourth electrode, a fourth resistive material layer, and a sixth electrode, and the fourth electrode is electrically coupled to the first electrode, and
wherein the first electrode and the second electrode are spaced apart by a first distance, the first electrode and the third electrode are spaced apart by a second distance greater than the first distance, the fourth electrode and the fifth electrode are spaced apart by a third distance, the fourth electrode and the sixth electrode are spaced apart by a fourth distance greater than the third distance, and a sum of the first distance and the fourth distance is substantially equal to that of the second distance and the third distance.

11. The semiconductor device of claim 10, wherein the first conductive feature is a first metal layer, and the second conductive feature is a second metal layer.

12. The semiconductor device of claim 11, wherein the first electrode protrudes from the second metal layer.

13. The semiconductor device of claim 11, wherein the first resistive material layer protrudes from the second metal layer.

14. The semiconductor device of claim 10, wherein the first transistor comprises a conductive via between the first conductive feature and the second conductive feature, the first electrode has a first vertical length, and the conductive via has a second vertical length smaller than the first vertical length.

15. A semiconductor device, comprising:
a first transistor comprising a first gate structure over a first fin;
a first resistive random access memory (RRAM) resistor; and
a second RRAM resistor, wherein
the first RRAM resistor comprises a first resistive material layer, a first electrode shared by the second RRAM resistor, and a second electrode, and a second gate structure over a second fin, wherein the first fin extends along a first direction, and the second fin extends along a second direction different from the first direction;
the second RRAM resistor comprises the first electrode, a second resistive material layer, and a third electrode; and
the first electrode is disposed between the second electrode and the third electrode.

16. The semiconductor device of claim 15, wherein the first transistor comprises:
a first metal layer; and
a second metal layer over the first metal layer, wherein the first electrode protrudes from the second metal layer.

17. The semiconductor device of claim 16, wherein the first resistive material layer is in contact with the second metal layer.

18. The semiconductor device of claim 15, wherein the first electrode has a first vertical length along a third direction substantially perpendicular to the first direction and the second direction, and the second electrode has a second vertical length different from the first vertical length.

19. The semiconductor device of claim 16, further comprising:
   a circuit, comprising:
      a second transistor;
      a third RRAM resistor; and
      a fourth RRAM resistor,
      wherein the circuit is electrically coupled to the second metal layer of the first transistor.

20. The semiconductor device of claim 19, wherein each of the first RRAM resistor, the second RRAM resistor, the third RRAM resistor, and the fourth RRAM resistor are aligned to each other in the second direction.

\* \* \* \* \*